(12) United States Patent
Ohashi et al.

(10) Patent No.: US 7,126,366 B2
(45) Date of Patent: Oct. 24, 2006

(54) SEMICONDUCTOR TEST APPARATUS

(75) Inventors: Masatoshi Ohashi, Tokyo (JP);
Toshiyuki Okayasu, Tokyo (JP)

(73) Assignee: Advantest Corp., Tokyo (JP)

( * ) Notice: Subject to any disclaimer, the term of this patent is extended or adjusted under 35 U.S.C. 154(b) by 46 days.

(21) Appl. No.: 10/516,093

(22) PCT Filed: Jun. 10, 2003

(86) PCT No.: PCT/JP03/07315

§ 371 (c)(1),
(2), (4) Date: Nov. 24, 2004

(87) PCT Pub. No.: WO03/104826

PCT Pub. Date: Dec. 18, 2003

(65) Prior Publication Data

US 2005/0231227 A1     Oct. 20, 2005

(30) Foreign Application Priority Data

Jun. 10, 2002   (JP)   ............................. 2002-168304

(51) Int. Cl.
*G01R 31/02* (2006.01)
*G01R 31/28* (2006.01)
*G01R 31/26* (2006.01)

(52) U.S. Cl. .................. 324/765; 324/158.1; 324/363; 714/744; 702/72

(58) Field of Classification Search ................ 324/765; 714/744; 702/72
See application file for complete search history.

(56) References Cited

U.S. PATENT DOCUMENTS 6,016,566 A * 1/2000 Yoshida ...................... 714/736
6,789,224 B1 * 9/2004 Miura ......................... 714/744
2002/0003433 A1 * 1/2002 Housako ...................... 324/765
2006/0036411 A1 * 2/2006 Nagai ......................... 702/189

FOREIGN PATENT DOCUMENTS

| JP | 11-038086 | 2/1999 |
| JP | 2001-201532 | 7/2001 |
| JP | 2001-351381 | 12/2001 |
| JP | 2001-356153 | 12/2001 |
| JP | 2002-025294 | 1/2002 |
| WO | WO 01/95075 | 12/2001 |

\* cited by examiner

*Primary Examiner*—Vinh Nguyen
*Assistant Examiner*—Emily Y Chan
(74) *Attorney, Agent, or Firm*—Muramatsu & Associates

(57) ABSTRACT

Good device PASS/FAIL determination is realized by measuring timings of both signals, i.e., a cross point of differential clock signals CLK and a data signal DATA output from a DUT, and obtaining a relative phase difference between both signals. A semiconductor test apparatus comprises differential signal timing measurement means for outputting cross point information Tcross obtained by measuring a timing of a cross point of one of differential signals output from the device under test, non-differential signal timing measurement means for outputting data change point information Tdata obtained by measuring a timing of transition of a logic of the other non-differential signal output from the DUT, phase difference calculation means for outputting a phase difference ΔT obtained by calculating a relative phase difference between the cross point information Tcross and the data change point information Tdata obtained by simultaneously measuring both of the output signals, and PASS/FAIL determination means for determining PASS/FAIL of a relative positional relation of the DUT based on a predetermined threshold value for executing PASS/FAIL determination upon reception of the phase difference ΔT.

8 Claims, 13 Drawing Sheets

FIG. 3
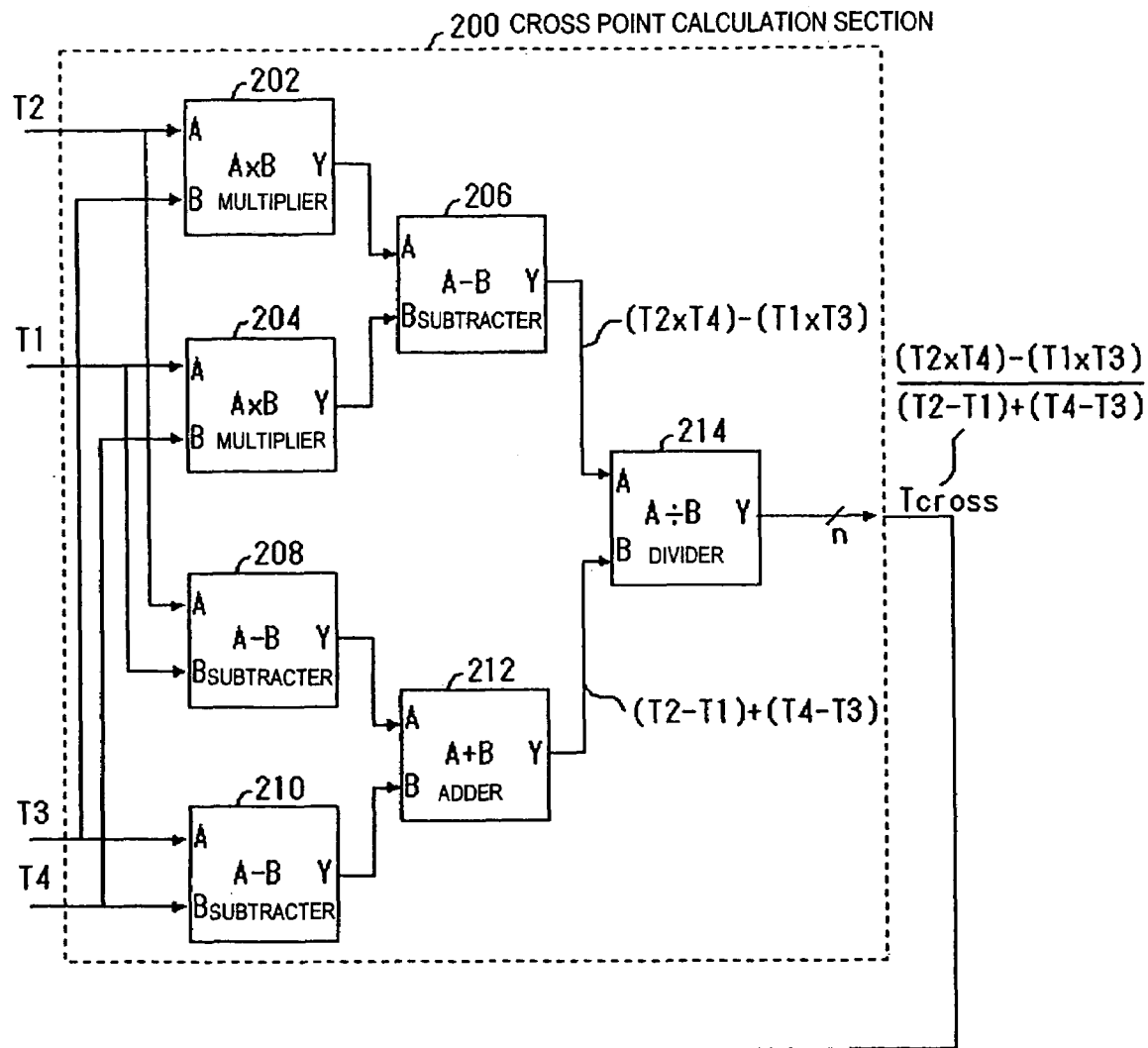
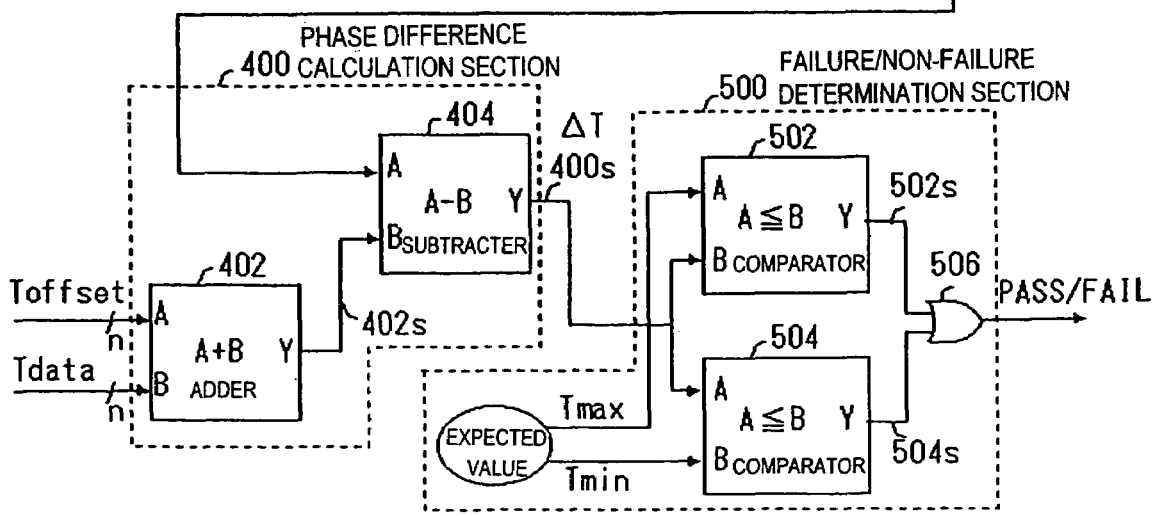

FIG. 5(a)
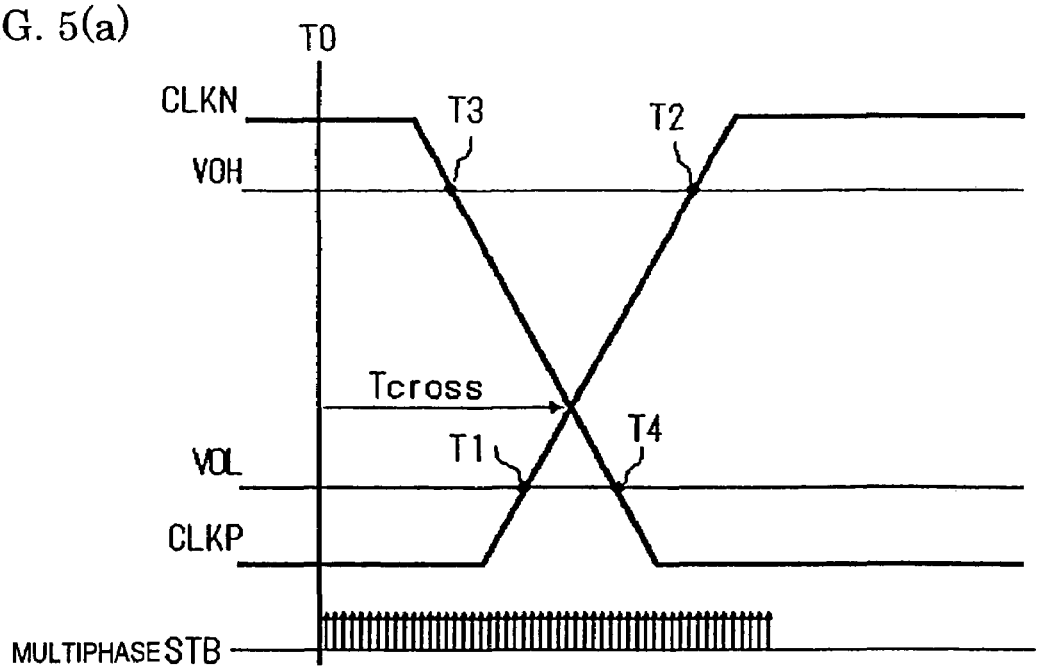
FIG. 5(b)
$$T_{cross} = \frac{(T2 \times T4) - (T1 \times T3)}{(T2 - T1) + (T4 - T3)}$$
FIG. 5(c)
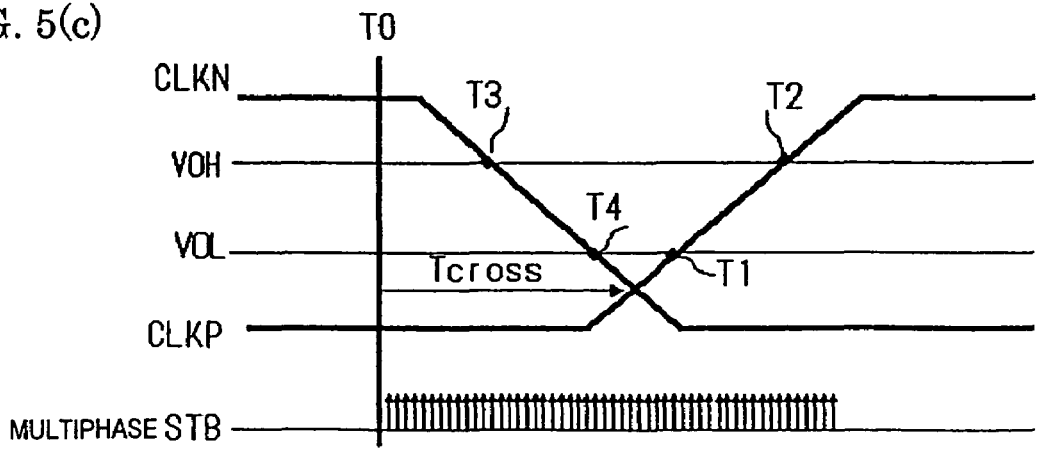

FIG. 7(a) IDEAL DIFFERENTIAL SIGNAL
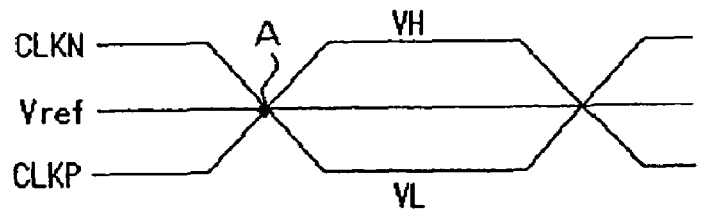
FIG. 7(b) ACTUAL DIFFERENTIAL SIGNAL
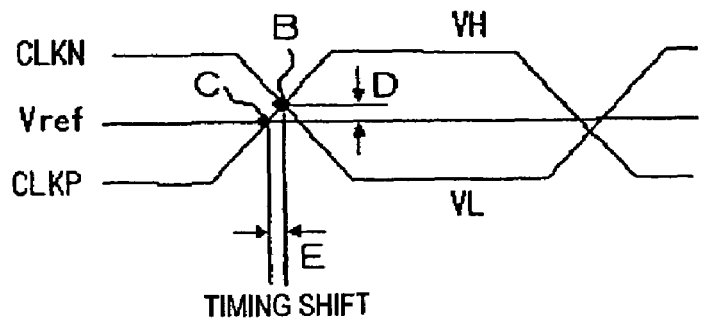
FIG. 7(c) INPHASE CHANGE
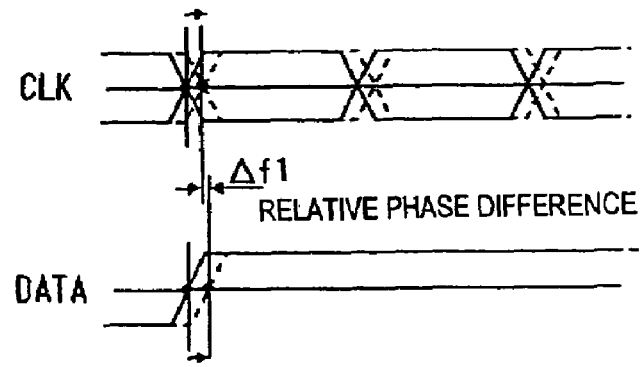
FIG. 7(d) REVERSED PHASE CHANGE
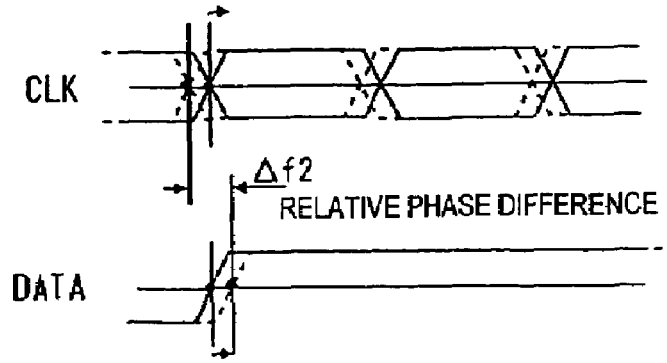

US 7,126,366 B2

SEMICONDUCTOR TEST APPARATUS

CROSS-REFERENCES TO RELATED APPLICATION

This application claims the priority of 371 of PCT/JP03/07315, filed Jun. 10, 2003, the disclosure of which is incorporated herein by reference.

TECHNICAL FIELD

The present invention relates to a semiconductor test apparatus for testing a device under test (DUT) which outputs a differential clock signal. More particularly, the invention relates to a semiconductor test apparatus for testing a relative phase difference between a cross point of one differential clock signal CLK output from the DUT and the other data signal DATA output from the DUT.

BACKGROUND ART

Background arts concerning the application will be described. Japanese Patent Application No. 2000-178917 (semiconductor device testing method/semiconductor device testing apparatus) discloses a testing method for testing a semiconductor device with high accuracy which outputs a reference clock DQS used for data transfer in synchronization with data reading within a short time.

Japanese Patent Application No. 2000-9113 (semiconductor device testing method/semiconductor device testing apparatus) discloses a testing method for testing a semiconductor device with high accuracy which outputs a reference clock DQS used for data transfer in synchronization with data reading within a short time.

Additionally, Japanese Patent Application No. 2000-204757 (semiconductor device testing method/semiconductor device testing apparatus) discloses a testing method of determining a failure based on a phase difference between a reference clock and data in a semiconductor device which outputs the reference clock in synchronization with data reading and outputting and uses the reference clock for data transfer.

However, since a cross point of the differential clock signals CLK cannot be specified by the background arts, it is impossible to accurately determine PASS/FAIL based on a relative phase difference between the differential clock signal and the other signal.

Next, problems concerning the present invention will be described.

FIG. 6(a) shows a principle circuit connection when high-speed data transfer is executed between two devices on a circuit board or the like in synchronization with a differential clock output as a balanced signal, which is used for differential transmission such as ECL or LVDS.

Differential clock signals CLK (positive clock signal CLKP, negative clock signal CLKN) are output from a differential driver DR1 of a device 1, and supplied through a transmission line to a differential receiver RCV2 of a device 2. One or a plurality of data signals DATA synchronized with a clock are supplied from a flip-flop FF1 of the device 1 to an input terminal of a flip-flop FF2 of the device 2, and retimed by a clock of the differential receiver RCV2 before being used. Incidentally, in the differential clock signal, a variance of output amplitude occurs due to an IC manufacturing variance, phase shifting occurs between differential signals due to circuitry, or other problems occur due to other causes. Further, some jitter components may be contained in the differential clock or the data TADA, or common mode noise may be generated.

Thus, in consideration of the foregoing, the device 1 which is a device under test (DUT) is required to output signals based on a prescribed phase relation between a clock and data. A semiconductor test apparatus must be able to determine PASS/FAIL by measuring the output conditions of the differential clock signal and the data DATA based on the prescribed phase relation. Incidentally, the differential driver DR1 can be controlled to a high impedance state by turning off the output. Thus, there is a need to be able to test this driver in the high impedance state.

FIG. 6(b) shows a main portion of the semiconductor test apparatus which comprises a comparator CP used in a single end (unbalanced type) form to receive each of the positive clock signal CLKP and the negative clock signal CLKN that are differential clock signals output from the DUT. Here, the semiconductor test apparatus is constituted such that comparators CP of 2-channel single ends individually receive the differential clock signals output from the DUT because of a need to measure each. For example, a reason is that there is a test item in the high impedance state (Hi-Z mode) of the differential clock signal of the DUT, and there is a need to be able to test this item.

In FIGS. 6a and 6b, the first comparator CP receives one positive clock signal CLKP, and converts the signal into a logical signal at a predetermined threshold level Vref. A timing comparator TC receives the logical signal, and determines PASS/FAIL based on a signal held by a strobe signal STRB of a desired timing.

The second comparator CP receives the negative clock signal CLKN, and converts the clock signal CLKN into a logical signal at a predetermined threshold level Vref. The timing comparator TC receives the logical signal, and determines PASS/FAIL for each single end signal based on a signal held by a strobe signal STRB of a desired timing.

Now, in the case of an ideal differential signal of FIG. 7a, a cross point (point A in FIG. 7a) of clock signals only needs be converted into a logical signal at a threshold level Vref of an intermediate voltage which is ½ of amplitude.

However, as shown in an actual differential signal example of FIG. 7b, if a cross point is converted into a logical signal at a threshold level Vref, it is detected as a cross point (point C in FIG. 7b) shifted from a target cross point (point B in FIG. 7b). Consequently, a problem of a timing shift (difference E in FIG. 7b) occurs between the two cross points, causing accuracy deterioration of timing measurement. Especially, when a clock frequency becomes several hundred MHz or higher, an influence of measuring accuracy is increased. As the semiconductor test apparatus is a measuring device in which highly accurate timing measurement is necessary, this poses a serious practical problem.

FIG. 7c shows a case in which in simultaneous measurement of both signals, i.e., a differential clock signal CLK and a data signal DATA, jitters such as inter-signal interference noise or power supply noise cause an inphase change between the two signals. In this case, an instantaneous relative phase difference Δf between the two signals is small. PASS/FAIL determination must be made to judge whether it is within a normal phase range or not by measuring such an instantaneous phase difference Δf1.

Conversely, FIG. 7d shows a case in which in simultaneous measurement of both signals, i.e., a differential clock signal CLK and a data signal DATA, jitters cause a reversed phase change between the two signals. In this case, an instantaneous relative phase difference Δf between the two signals is increased. PASS/FAIL determination must be made to judge whether it is within a normal phase rage or not by measuring an instantaneous phase difference Δf2 caused by the jitters. Apparently, it is necessary to determine PASS/FAIL by simultaneously measuring the relative phase difference between the two signals.

As described above, the single end comparators CP are applied to the two channels to specify the position of the cross point of the differential clock signals CLK. However, it is impossible to accurately specify the position of the cross point because the phase difference, the amplitude difference or the like between the positive clock signal CLKP and the negative clock signal CLKN causes the movement of the cross point.

To accurately evaluate phases of both signals, i.e., the differential clock signal CLK and the data signal DATA, both signals must be simultaneously sampled and measured, the cross point of the differential clock signals CLK must be specified, and the phases of the specified cross point and the data signal DATA must be evaluated.

However, according to the conventional technology, it is impossible to determine PASS/FAIL by accurately obtaining a relative phase difference between the two signals, i.e., the cross point of the differential clock CLK and the data signal DATA. Because a semiconductor test apparatus is a measuring device in which highly accurate timing measurement is necessary, this poses an unfavorable practical problem.

Therefore, an object of the invention is to provide a semiconductor test apparatus which can realize good device PASS/FAIL determination by using 2-channel single end comparators CP, measuring and specifying a timing of a cross point of differential clock signals output from a DUT, measuring a timing of the other data signal DATA output from the DUT, and obtaining a relative phase difference between the two signals.

Another object is to provide a semiconductor test apparatus which can accurately measure and obtain a cross point of differential clock signals output from a DUT by using 2-channel single end comparators CP. Another object is to provide a semiconductor test apparatus which can specify a relative phase difference between a differential signal output from a DUT and the other single end signal or differential signal output from the DUT. Another object is to provide a semiconductor test apparatus which can measure relative jitter amounts of a differential signal output from the DUT and the other signal output from the DUT.

DISCLOSURE OF THE INVENTION

First solving means of the present invention will be described. FIGS. 4 and 1 show solving means concerning the invention.

To solve the problems, a semiconductor test apparatus is characterized by comprising:

differential signal timing measurement means (e.g., cross point measurement section 600) for outputting cross point information Tcross obtained by measuring a timing of a cross point of differential signals output from a device under test (DUT);

non-differential signal timing measurement means (e.g., data measurement means 300) for outputting data change point information Tdata obtained by measuring a timing of transition of a logic of the other non-differential (single end) signal output from the DUT;

phase difference calculation means (e.g., phase difference calculation section 400) for outputting a phase difference ΔT obtained by calculating a relative phase difference between the cross point information Tcross and the data change point information Tdata obtained by simultaneously measuring both of the output signals; and PASS/FAIL determination means (e.g., PASS/FAIL determination section 500) for determining PASS/FAIL of of the phase difference ΔT of the DUT with respect to a predetermined range by executing PASS/FAIL determination upon reception of the phase difference ΔT based on predetermined upper and lower limit threshold values or one of the threshold values.

According to the invention, a comparator CP of a 2-channel single end is used, the timing of the cross point of differential signals output from the DUT is measured to be specified, the timing of the other data signal DATA output from the DUT is measured, and the relative phase difference between both signals is obtained. Thus, it is possible to realize a semiconductor test apparatus which can execute good device PASS/FAIL determination.

Next, second solving means will be described. FIG. 13 shows solving means concerning the invention.

A semiconductor test apparatus is characterized by comprising:

first differential signal timing measurement means (e.g., cross point measurement section 600) for outputting first cross point information Tcross obtained by measuring a timing of a cross point of first differential signals output from a device under test (DUT);

second differential signal timing measurement means (e.g., cross point measurement section 600) for outputting second cross point information Tcross obtained by measuring a timing of a cross point of the other second differential signals output from the DUT;

phase difference calculation means (e.g., phase difference calculation section 400) for outputting a phase difference ΔT obtained by calculating a relative phase difference between the first cross point information Tcross and the second cross point information Tcross which are obtained by simultaneously measuring both of the output differential signals; and PASS/FAIL determination means (e.g., PASS/FAIL determination section 500) for determining PASS/FAIL of the DUT upon reception of the phase difference ΔT based on predetermined upper and lower limit threshold values or one of the threshold values corresponding to the DUT.

Thus, it is possible to determine PASS/FAIL of the relative phase difference by specifying the relative phase difference between the two types of differential signals.

Next, third solving means will be described. FIG. 4, FIGS. 5a to 5c, and FIG. 1 show solving means concerning the invention.

To solve the problems, a semiconductor test apparatus which highly accurately measures a relative phase difference between a cross point and the other data signal DAT output from a device under test (DUT) by using a timing of the cross point of differential signals output from the DUT as a reference is characterized by comprising:

first transition information measurement means (e.g., first transition information collection means 100#1) for converting the signals into logical signals at predetermined threshold levels VOH, VOL for measuring two points before and after the cross point with respect to a transition waveform of one of the output differential signals, sampling and measuring the signals based on a multiphase strobe signal of a known timing, converting the signals into code data, and then outputting the code data as two bits of timing information;

second transition information measurement means (e.g., second transition time information collection means 100#2)

for converting the signals into logical values at predetermined threshold levels VOH, VOL for measuring two points before and after the cross point with respect to a transition waveform of the other of the output differential signals, sampling and measuring the signals based on a multiphase strobe signal of a known timing, converting the signals into code data, and then outputting the code data as two bits of timing information;

cross point calculation means (e.g., cross point calculation section 200) for specifying a position of intersection of both straight lines as cross point information Tcross, the straight lines being a first straight line which passes between the two bits of timing information obtained from the transition waveform of one of the output differential signals, and a second straight line which passes between the two bits of timing information obtained from the transition waveform of the other of the output differential signals;

data transition time information collection means (e.g., data measurement section 300) for receiving the other data signal DATA output from the DUT, converting the signal into a logical signal at a predetermined threshold level Vref, sampling and measuring the signal based on a multiphase strobe signal of a known timing, converting the signal into code data indicating timing information of one of rising and falling of the data signal DATA, and then outputting the code data as data change point information Tdata;

phase difference calculation means (e.g., phase difference calculation section 400) for obtaining and outputting a relative phase difference $\Delta T$ between the cross point information Tcross and the data change point information Tdata; and PASS/FAIL determination means (e.g., PASS/FAIL determination section 500) for receiving the phase difference $\Delta T$, and executing PASS/FAIL determination to decide whether the phase difference is within a phase difference standard of the DUT type or not.

Next, fourth solving means will be described. FIGS. 4 and 1 show solving means concerning the invention.

To solve the problem, a semiconductor test apparatus in which a device under test outputs differential signals (e.g., positive and negative clock signals) and at least one data signal DATA synchronized therewith, and which comprises a constitution of individually receiving the positive and negative differential signals in a single end form (unbalanced form) from an analog comparator, and highly accurately measures a relative phase difference between a cross point and the data signal DATA when a timing of the cross point of the two positive and negative differential signals output from the DUT is a reference, is characterized by comprising:

first transition information measurement means (e.g., first transition time information collection means 100#1) for converting the signals into logical signals at predetermined two low and high threshold levels for generating a cross point with respect to a transition waveform of one of the output differential signals, sampling and measuring the signals based on a multiphase strobe signal of a known timing, converting the signals into code data, and then outputting the code data as first timing information T1 and second timing information T2;

second transition information measurement means (e.g., second transition time information collection means 100#2) for converting the signals into logical values at predetermined two high and low threshold levels for generating a cross point with respect to a transition waveform of the other of the output differential signals, sampling and measuring the signals based on a multiphase strobe signal of a known timing, converting the signals into code data, and then outputting the code data as third timing information T3 and fourth timing information T4;

cross point calculation means (e.g., cross point calculation section 200) for obtaining a position of intersection of both straight lines as cross point information Tcross, the straight lines being a first straight line through which one transition waveform passes based on the first timing information T1 and the second timing information T2 obtained therefrom, and a second straight line through which the other wave form passes based on the third timing information T3 and the fourth timing information T4 obtained therefrom;

data transition time information collection means (e.g., data measurement section 300) for receiving the data signal DATA output from the DUT, converting the signal into a logical signal at a predetermined threshold level Vref, then sampling and measuring the signal based on a multiphase strobe signal of a known timing, converting the signal into code data indicating a rising or falling timing of the data signal DATA, and outputting the code data as data change point information Tdata;

phase difference calculation means (e.g., phase difference calculation section 400) for obtaining and outputting a relative phase difference $\Delta T$ between the cross point information Tcross and the data change point information Tdata; and PASS/FAIL determination means (e.g., PASS/FAIL determination section 500) for receiving the obtained phase difference $\Delta T$, and executing PASS/FAIL determination to decide whether the phase difference is within a phase difference standard (e.g., maximum phase difference Tmax, minimum phase difference Tmin) for the DUT type.

Next, fifth solving means will be described. FIGS. 5*a* to 5*c* show solving means concerning the invention.

To solve the problems, a semiconductor test apparatus which highly accurately measures a timing of a cross point of differential signals output from a device under test is characterized by comprising:

first transition information measurement means (e.g., first transition time information collection means 100#1) for converting the signals into logical signals at predetermined threshold levels VOH, VOL for measuring two points before and after the cross point with respect to a transition waveform of one of the output differential signals, sampling and measuring the signals based on a multiphase strobe signal of a know timing, converting the signals into code data, and outputting the code data as two bits of timing information;

second transition information measurement means (e.g., second transition time information collection means 100#2) for converting the signals into logical values at predetermined threshold levels VOH, VOL for measuring two points before and after the cross point with respect to a transition waveform of the other of the output differential signals, sampling and measuring the signals based on a multiphase strobe signal of a known timing, converting the signals into code data, and then outputting the code data as two bits of timing information; and cross point calculation means (e.g., cross point calculation section 200) for specifying a position of intersection of both straight lines as cross point information Tcross, the straight lines being a first straight line which passes between the two bits of timing information obtained from the transition waveform of one of the output differential signal, and a second straight line which passes between the two bits of timing information obtained from the transition waveform of the other of the output differential signals.

Thus, the cross point of the differential signals can be accurately specified.

Next, sixth solving means will be described. FIG. 1 shows solving means concerning the invention.

The semiconductor test apparatus is characterized in that a mode of the transition information measurement means (e.g., first transition time information collection means 100#1, second transition time information collection means 100#2) comprises: a first analog comparator CP1, first multiphase strobe means 10 and a first edge detection section 52 for generating the fist timing information T1; and a second analog comparator CP2, second multiphase strobe means 10 and a second edge detection section 51 for generating the second timing information T2.

The first analog comparator CP1 receives the signal output from the DUT, converts the signal into a logical signal at a predetermined low level VOL, and supplies the logical signal to the first multiphase strobe means 10.

The first multiphase strobe means 10 receives the logical signal from the first analog comparator CP1, generates multistrobe signals of a plurality of m to which a very small phase difference is given therein, samples the logical signal based on the generated multistrobe signals of the plurality of m, and outputs a low-side holding signal LD#i (i=1 to m) of a plurality of m bits.

The first edge detection section 52 is a data encoder which receives the low-side holding signal LD#i of the plurality of m bits, encodes and converts an m-bit input into an n-bit output based on an edge selecting signal S2 for selecting a rising or falling edge direction, and outputs the n-bit data as the first timing information T1.

The second analog comparator CP2 receives the signal output from the DUT, converts the signal into a logical signal at a predetermined high level VOH, and supplies the logical signal to the second multiphase strobe means 10.

The second multiphase strobe means 10 receives the logical signal from the second analog comparator CP2, generates multistrobe signals of a plurality of m to which a very small phase difference is given therein, samples the logical signal based on the generated multistrobe signals of the plurality of m, and outputs a high-side holding signal HD#i of a plurality of m bits.

The second edge detection section 51 is a data encoder which receives the high-side holding signal HD#i of the plurality of m bits, encodes and converts an m-bit input into an n-bit output based on an edge selecting signal S2 for selecting a rising or falling edge direction, and outputs the n-bit data as the second timing information T2.

Next, seventh solving means will be described. FIG. 1 shows solving means concerning the invention.

The semiconductor test apparatus is characterized in that a mode of the data transition time information measurement means (e.g., data measurement section 300) comprises an analog comparator, multi-phase strobe means 10, a first edge detection section, a second edge detection section, and a multiplexer 350 for generating the timing information T1.

The analog comparator receives the data signal DATA of the non-differential signals output from the DUT, converts the signal into a logical signal at a predetermined threshold level Vref, and supplies the logical signal to the multiphase strobe means 10.

The multiphase strobe means 10 receives the logical signal from the analog comparator, generates multistrobe signals of a plurality of m to which a very small phase difference is given therein, samples the logical signal based on the generated multistrobe signals of the plurality of m, and outputs a holding signal D#i (i=1 to m) of a plurality of m bits.

The first edge detection section is a data encoder which receives the holding signal D#i of the plurality of m bits, encodes and converts an m-bit input into an n-bit output based on an edge selecting signal S2 for selecting a rising edge direction, and outputs the n-bit data as one timing information Tdh of the rising side.

The second edge detection section is a data encoder which receives the holding signal D#i of the plurality of m bits, encodes and converts an m-bit input into an n-bit output based on an edge selecting signal S2 for selecting a falling edge direction, and outputs the n-bit data as the other timing information Td1 of the falling side.

The multiplexer 350 receives the one timing information Tdh of the rising side and the other timing information Td1 of the falling side, selects one of the bits of timing information based on a data edge selecting signal S3 for selecting a data edge, and outputs the information as data change point information Tdata.

Next, eighth solving means will be described. FIG. 12 shows solving means concerning the invention.

The semiconductor test apparatus is characterized in that a mode of the data transition time information measurement means (e.g., data measurement section 300) comprises an analog comparator, multi-phase strobe means 10, and an edge detection section for generating the timing information T1.

The analog comparator receives the data signal DATA of the non-differential signals output from the DUT, converts the signal into a logical signal at a predetermined threshold level Vref, and supplies the logical signal to the multiphase strobe means 10.

The multiphase strobe means 10 receives the logical signal from the analog comparator, generates multistrobe signals of a plurality of m to which a very small phase difference is given therein, samples the logical signal based on the generated multistrobe signals of the plurality of m, and outputs a holding signal D#i of a plurality of m bits.

The edge detection section is a data encoder which receives the holding signal D#i of the plurality of m bits, encodes and converts an m-bit input into an n-bit output based on a data edge selecting signal S3 for selecting a rising or falling edge direction, and outputs the n-bit data as data change point information Tdata.

Next, ninth solving means will be described. FIG. 3 and FIGS. 5a to 5c show solving means concerning the invention.

The semiconductor test apparatus is characterized in that according to a mode of the cross point calculation means (e.g., cross point calculation section 200), the cross point information Tcross is generated to be output by calculating Tcross=$\{(T2 \times T4)-(T1 \times T3)\}/\{(T2-T1)+(T4-T3)\}$ in which T1 is the first timing information obtained by the first transition information measurement means, T2 is the second timing information, T3 is the third timing information obtained by the second transition information measurement means, and T4 is the fourth timing information.

Next, tenth solving means will be described. FIG. 11 shows solving means concerning the invention.

The semiconductor test apparatus is characterized in that a mode of the cross point calculation means comprises a cross point conversion memory 250 for data conversion, and the cross point conversion memory 250 prestores cross point information Tcross corresponding to the arithmetic operation therein, supplies data of bits of timing information T1, T2, T3 and T4 to an address input terminal, and outputs data read by the address input terminal as cross point information Tcross in which T1 is the first timing information obtained by the first transition information measurement means, T2 is the second timing information, T3 is the third timing information obtained by the second transition information measurement means, and T4 is fourth timing information.

Next, eleventh solving means will be described. FIG. 3 shows solving means concerning the invention.

The semiconductor test apparatus is characterized in that according to a mode of the phase difference calculation means (e.g., phase difference calculation section 400), the cross point information Tcross from the cross point calculation means and the data change point information Tdata from the data transition time information collection means (e.g., data measurement section 300) are received, and a relative phase difference ΔT obtained by calculating a difference between both data, or a phase difference ΔT obtained as a result of adding a predetermined offset amount (offset time Toffset) to the phase difference ΔT is output.

Next, twelfth solving means will be described. FIG. 3 shows solving means concerning the invention.

The semiconductor test apparatus is characterized in that according to a mode of the PASS/FAIL determination means (e.g., PASS/FAIL determination section 500), the relative phase difference ΔT is received from the phase difference calculation means, and DUT PASS/FAIL determination is made to decide whether the phase difference is within a permissible range from a predetermined maximum phase difference Tmax to a predetermined minimum phase difference Tmin for executing the DUT PASS/FAIL determination.

Next, thirteenth solving means will be described. FIG. 10 shows solving means concerning the invention.

The semiconductor device is characterized by further comprising PASS/FAIL determination control means in addition to the cross point calculation means and the PASS/FAIL determination means, and in that:

the PASS/FAIL determination control means causes the cross point calculation means to generate a data error signal Derr by understanding that a normal cross point has not been measured when a data value of at least one of the four bits of timing information, i.e., the first timing information T1, the second timing information T2, the third timing information T3, and the fourth timing information T4, output from the transition information measurement means (e.g., first transition time information collection means 100#1, second transition time information collection means 100#2) is "0", and the PASS/FAIL determination means comprises means for controlling the inside not to execute PASS/FAIL determination when the data error signal Derr is received.

Next, fourteenth solving means will be described. FIG. 9 shows solving means concerning the invention.

To solve the problems, a semiconductor test apparatus which highly accurately measures a relative phase difference between a cross point and the other data signal DATA output from a device under test (DUT) by using a timing of the cross point of differential signals output from the DUT as a reference is characterized by comprising:

first transition information measurement means (e.g., first transition time information collection means 100#1) for converting the signals into logical signals at predetermined two low and high threshold levels, sampling and measuring the signals based on a multiphase strobe signal of a known timing, converting the signals into code data, and then outputting the code data as first timing information T1 and second timing information T2;

second transition information measurement means (e.g., second transition time information collection means 100#2) for converting the signals into logical values at predetermined two high and low threshold levels with respect to a transition waveform of the other of the output differential signals, sampling and measuring the signals based on a multiphase strobe signal of a known timing, converting the signals into code data, and then outputting the code data as third timing information T3 and fourth timing information T4;

data transition time information collection means (e.g., data measurement section 300) for receiving the data signal DATA output from the DUT, converting the signal into a logical signal at a predetermined threshold level Vref, sampling and measuring the signal based on a multiphase strobe signal of a known timing, converting the signal into code data indicating a rising or falling timing of the data signal DATA, and then outputting the code data as data change point information Tdata;

edge data storage means (e.g., edge data storage memory 700) of a predetermined storage capacity for measuring, by a predetermined number of times, and storing the two bits of timing information measured by the first transition information measurement means, the two bits of timing information measured by the second transition information measurement means, and one bit of timing information measured by the data transition time information collection means; and cross point calculation/PASS/FAIL determination processing means (e.g., cross point calculation/phase difference calculation/PASS/FAIL determination processing section 650) for reading data contents of the edge data storage means, calculating a relative phase difference ΔT between cross point information Tcross obtained by calculating the cross point by software and the data change point information Tdata, executing the arithmetic operation by the number of times corresponding to the number of measuring times, and making PASS/FAIL determination to decide whether a plurality of obtained phase differences ΔT are within a phase difference standard of the DUT type or not.

Next, fifteenth solving means will be described. FIG. 9 shows solving means concerning the invention.

The semiconductor test apparatus is characterized by further comprising a function of receiving the plurality of phase differences ΔT obtained by the cross point calculation/PASS/FAIL determination processing means corresponding to the number of measuring times, and obtaining a fluctuation amount of the plurality of phase differences ΔT to specify a jitter amount between both signals.

Thus, according to the invention, the components of the solving means may be properly combined to constitute other practical constitutions when desired. Moreover, reference numerals given to the components correspond to those of the embodiment of the invention, but the reference numerals are not limited to such. Other practical equivalents may be employed as components.

BRIEF DESCRIPTION OF THE DRAWINGS

FIG. 3 is a view showing a specific internal constitutional example of a cross point calculation section 200;

FIGS. 5a to 5c are views explaining calculation of cross point information;

FIGS. 7a to 7d are views explaining a cross point in the case of an ideal differential signal, a cross point in an actual differential signal example, and inphase and reversed phase changes between both signals, i.e., a differential clock signal CLK and a data signal DATA, caused by jitters or the like;

BEST MODE FOR CARRYING OUT THE INVENTION

Next, an embodiment of the present invention will be described with reference to the accompanying drawings. The describe contents of the embodiment are not limitative of appended claims. Elements, connection relations or the like are not essential to solving means. Further, adjective patterns/forms of the elements, the connection relations or the like of the embodiment are only examples and not limitative of the invention.

The invention will be described with reference to FIGS. 1 to 13.

Figure 1:
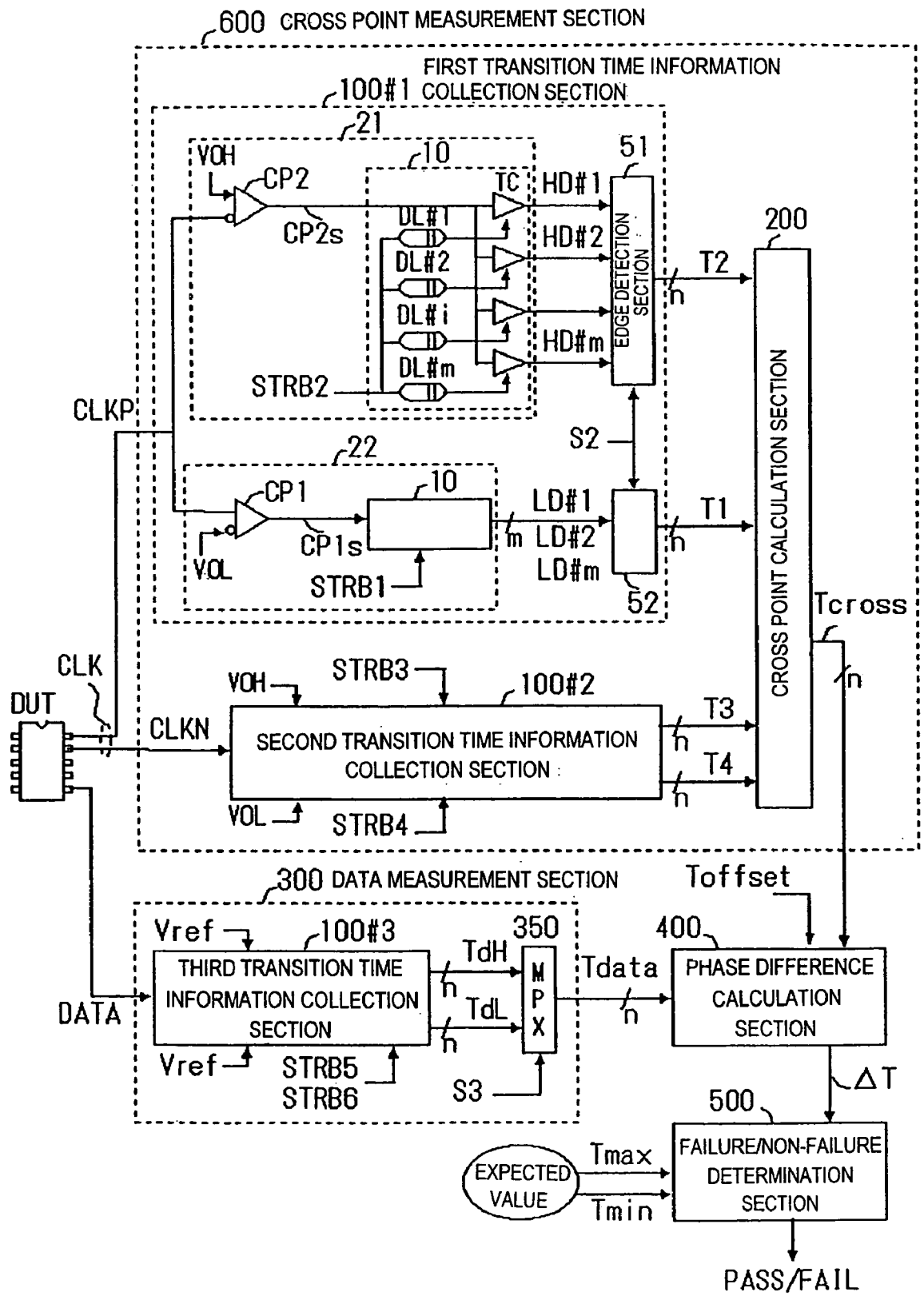
FIG. 1 is a view showing a main portion block constitutional example of a semiconductor test apparatus when a differential clock signal and a single end data signal DATA output from a DUT are received, and a relative phase difference therebetween is obtained to determine PASS/FAIL.

FIG. 1 shows a main portion block constitutional example of a semiconductor test apparatus when a differential clock signal and a single end data signal DATA output from a DUT are received, and a relative phase difference therebetween is obtained to determine PASS/FAIL. Incidentally, an entire constitution of the semiconductor test apparatus is described in Japanese Patent Application No. 2000-178917, and thus explanation thereof will be omitted.

As components, the semiconductor test apparatus comprises first transition time information collection means 100#1, second transition time information collection means 100#2, third transition time information collection means 100#3, a multiplexer 350, a cross point calculation section 200, a phase difference calculation section 400, and a PASS/FAIL determination section 500. A data measurement section 300 comprises the third transition time information collection means 100#3 and the multiplexer 350.

The first transition time information collection means 100#1 receives one positive clock signal CLKP of differential clock signals output from a DUT, converts the signal into a logical signal at two threshold levels VOH, VOL of a high side and a low side, then measures bits of timing information before and after transition of the logical signal by multiphase STB based on strobe signals STRB2, STRB1, and generates and outputs bits of timing information T2, T1 converted into code data which become time information. This internal element comprises high-side multiphase strobe means 21, low-side multiphase strobe means 22, and edge detection sections 51, 52.

Figure 4:
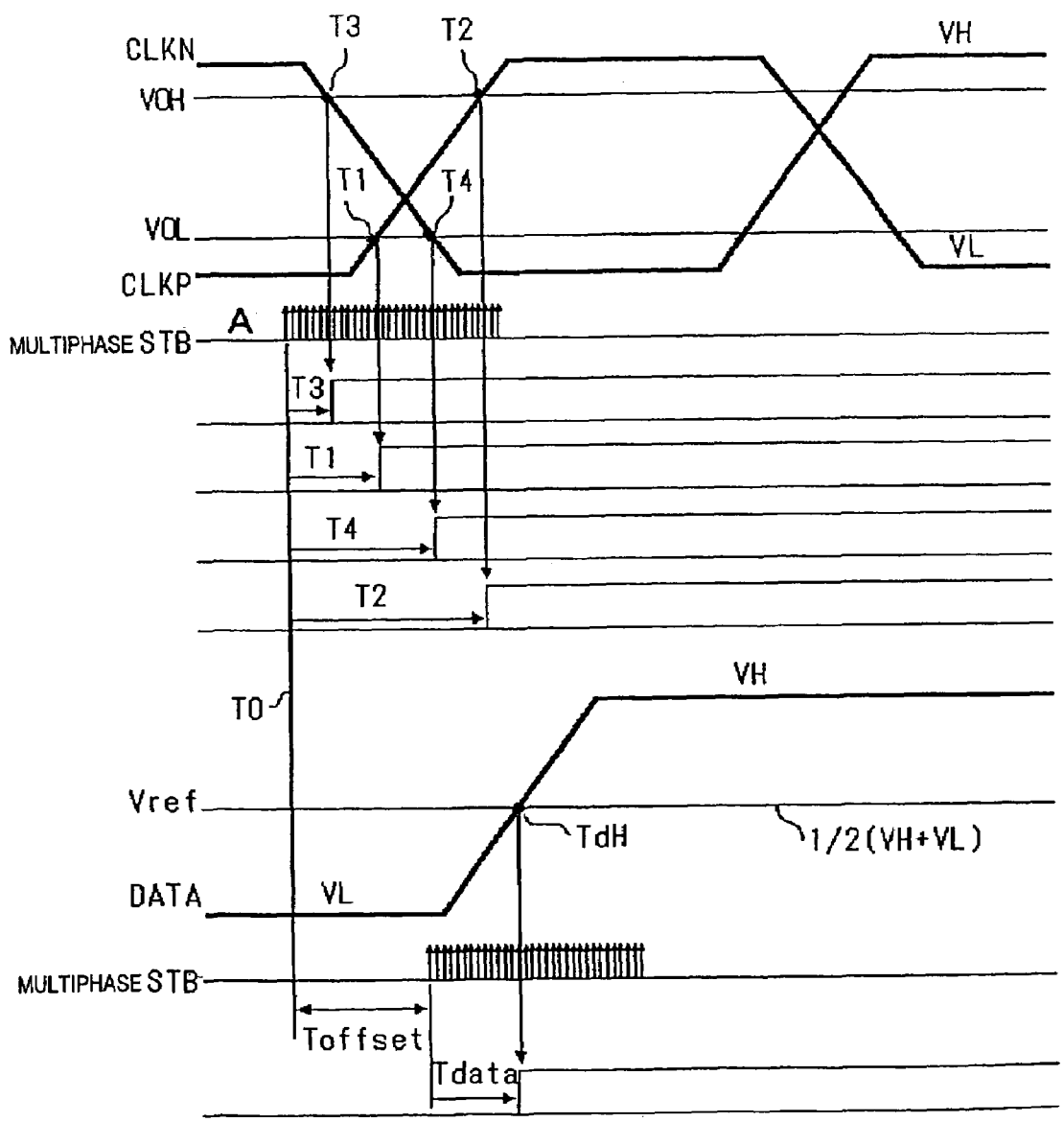
FIG. 4 is a simple timing chart showing bits of timing information T1 to T4, Tdh when strobe signals STRB1 to STRB4 are generated by the same reference timing T0.
Figure 6A:
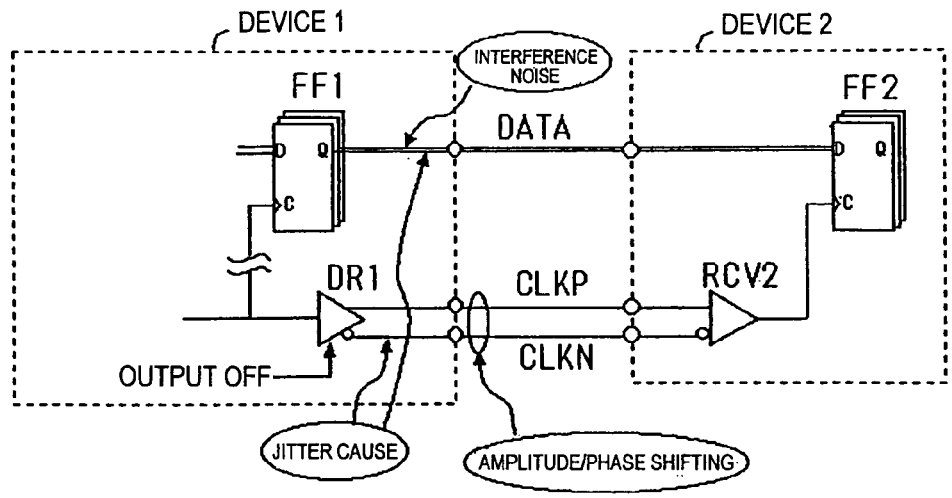
FIGS. 6a and 6b are views showing a principle circuit connection when high-speed data transfer is executed between two devices on a circuit board in synchronization with a differential clock, and a main portion of the semiconductor test apparatus which comprises a single end comparator CP to receive each of a positive clock signal CLKP and a negative clock signal CLKN which are differential clock signals output from the DUT.
Figure 6B:
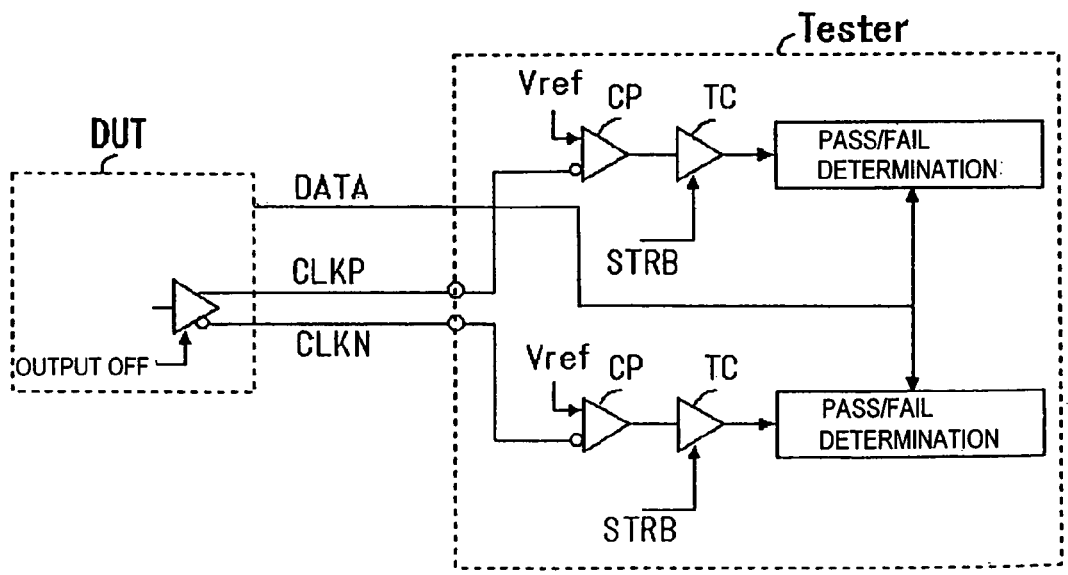

The high-side multiphase strobe means 21 outputs m-bit high-side holding signals HD#1 to HD#m obtained as a result of sampling logical signals converted at the high-side threshold level VOH by individual timings of m points by the multiphase STB (multiphase strobe signal) based on the strobe signal STRB2. An internal constitutional example comprises a comparator CP2 and multiphase strobe means 10. This constitution will be described with reference to a timing chart of FIG. 4. FIG. 4 is a simple timing chart showing bits of timing information T1 to T4, Tdh when strobe signals STRB1 to STRB4 are generated by the same reference timing T0.

The multiphase strobe means 10 receives one strobe signal STRB2 from a timing generator TG (not shown), finely delays the signal in a time-sequential manner to generate multiphase STB (see FIG. 4) of m points, samples logical signals CP2s output from the comparator CP2 by m pieces of timing comparators TC based on the generated STB of m points, and outputs m-bit high-side holding signals HD#1 to HD#m as a result of the sampling. Here, for a value of m, 16 points/32 points or the like are used. If a 20 pico-second pitch is applied, a fine delay amount can be obtained as fine pitch time information continuous over a section of 32 points×20 pico-seconds=640 pico-seconds. On the other hand, for the strobe signal STRB2 and each multiphase STB, a known timing can be set by calibration. Further, the strobe signal STRB2 can be generated and controlled by movement to an optional timing. Thus, as shown in FIG. 4, even the multiphase STB of a limited section can be sampled by moving the strobe signal STRB2 to positions before and after the high-side threshold level VOH of the positive clock signal CLKP.

An edge detection section 51 is a data encoder which comprises a function of selecting a rising or falling edge, and converts an m-bit input into an n-bit output. This will be described with reference to an encoding example of the edge detection section in the case of m=4 bits of FIG. 2a, and a circuitry example of FIG. 2b.

Figures 2A, 2B:
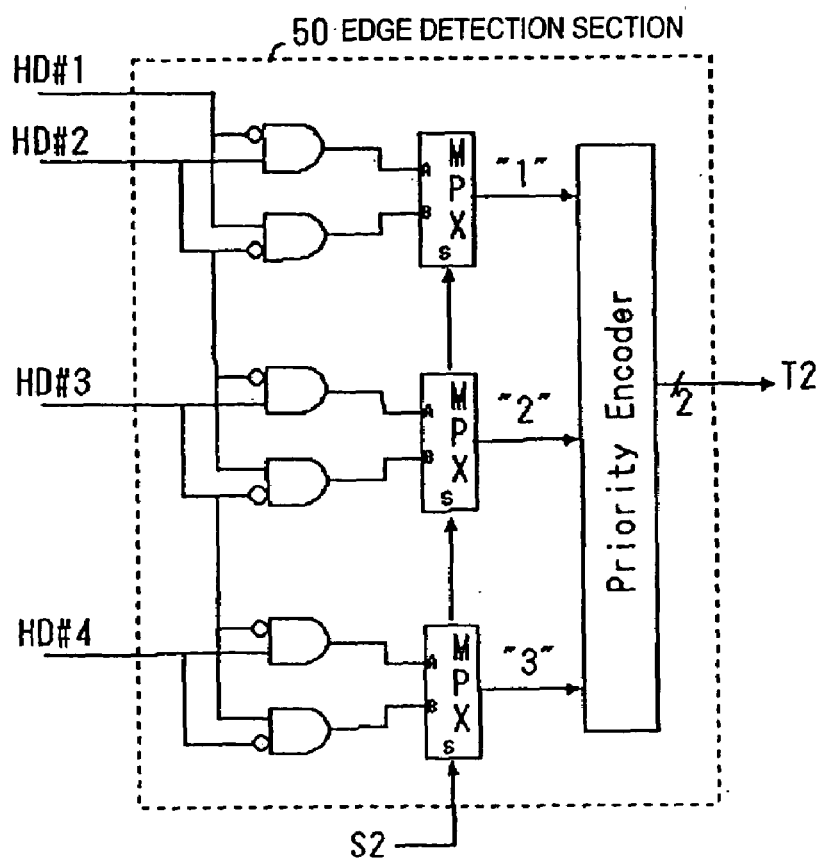
FIGS. 2a and 2b are views showing an encoding example of an edge detection section and a circuitry example in the case of m=4.

In FIG. 2a, first, encoding is executed by targeting a rising edge when an edge selecting signal S2 is "0". When input data is time-sequential data of "0111" (see A in FIG. 2a), the data is converted into an encoded 2-bit code data "1" and output. Similarly, when input data is time-sequential data of "0011" (see B in FIG. 2a), code data "2" is output. Similarly, when input data is time-sequential data of "0001" (see C in FIG. 2a), code data "3" is output.

Second, encoding is executed by targeting a falling edge when an edge selecting signal S2 is "1". As in the case of the foregoing, when input data is time-sequential data of "1000" (see A in FIG. 2a), code data "1" is output. Similarly, when input data is time-sequential data of "1100" (see B in FIG. 2a), code data "2" is output. Similarly, when input data is time-sequential data of "1110" (see C in FIG. 2a), code data "3" is output.

The circuitry example of FIG. 2b is an example to realize the aforementioned operation. A rising change or a falling change of the time-sequential data is detected and output by 6 AND gates of an inversion input terminal of one side, one of the rising change and the falling change is selected and output by 3 multiplexers and the edge selecting signal S2, and the 3-bits detected data is converted into 2-bit code data by a priority encoder and output as timing information T2.

Figure 8:
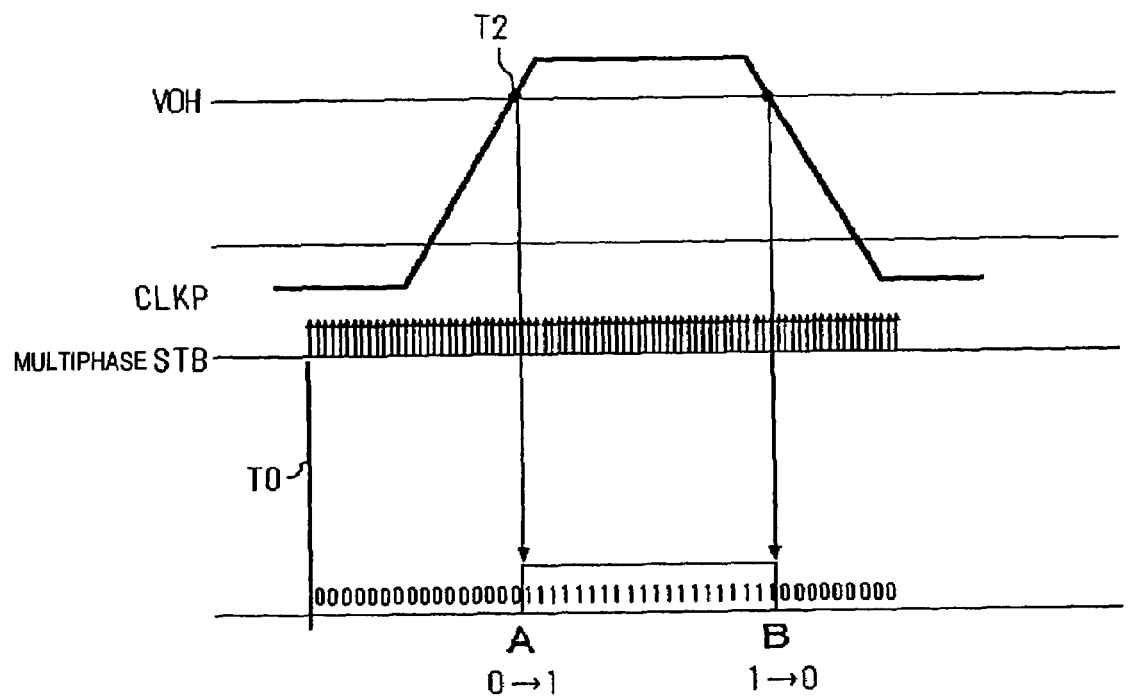
FIG. 8 is a timing chart showing an example in the case of a narrow pulse width.
Figure 9:
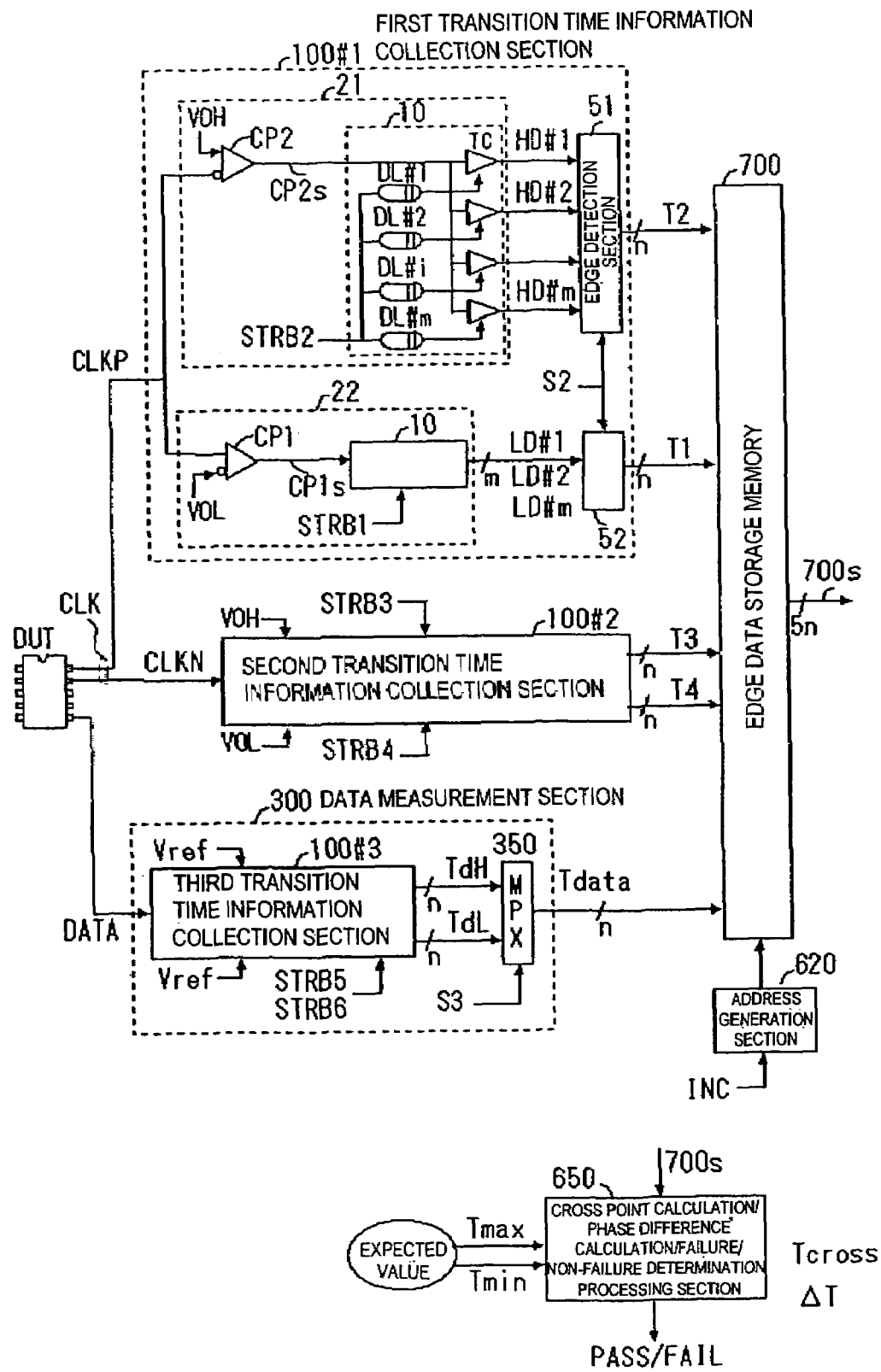
FIG. 9 is a view showing another main portion block constitutional example of the semiconductor test apparatus when a differential clock signal and a single end data signal DATA output from the DUT are received, and a relative phase difference therebetween is obtained to determine PASS/FAIL.

Now, a case of a narrow pulse width shown in FIG. 8 will be described. In the multiphase STB section, both of rising and falling sides of the positive clock signal CLKP may be present. However, by the edge selecting signal S2, a rising edge A or a falling edge B in FIG. 8 can be specified as a target of conversion. Accordingly, target code data can be generated without any troubles under such conditions.

Next, the low-side multiphase strobe means 22 shown in FIG. 1 is similar to the high-side multiphase strobe means 21, and outputs m-bit low-side holding signals LD#1 to LD#m obtained as a result of sampling logical signals converted at the low-side threshold level VOL by individual timings of m points by the multiphase STB based on the strobe signal STRB1. Incidentally, the strobe signal STRB1 and the strobe signal STRB2 may be shared by one strobe signal.

An edge detection section 52 is similar to the edge detection section 51, comprises a function of selecting a rising or falling edge, converts an m-bit input into an n-bit code data, and outputs the code data as timing information T1.

The second transition time information collection means 100#2 is similar to the first transition time information collection means 100#1, receives the other negative clock signals CLKN of the differential clock signals output from the DUT, converts the signals into logical signals at the high and low-side 2 threshold levels VOH, VOL, measures the signals by multiphase STB based on strobe signals STRB3, STRB4, and generates and outputs bits of timing information T3, T4 converted into code data which become time information.

The third transmission time information collection means 100#3 is almost similar to the first transition time information collection means 100#1, receives the data signal DATA output from the DUT, converts the signal into a logical signal at an intermediate threshold level Vref as shown in the lower side of the timing chart of FIG. 4, then measures the signal by multiphase STB based on strobe signals STRB5, STRB6, and generates and outputs bits of timing information Tdh, Td1 converted into code data which become time information. At this time, there may be an offset time Toffset between the strobe signals STRB5, STRB6 and the strobe signals STRB1 to STRB4 with respect to the reference timing T0 shown in FIG. 4. However, the offset time Toffset is known time information since the strobe signals STRB1 to STRB6 are known timings.

Since the third transition time information collection means 100#3 only needs to convert the signals into the logical signals at the same threshold levels Vref, this internal component may comprise only one multiphase strobe means 10 shown in FIG. 1, share the output signal thereof, and supply the signal to both of the edge detection sections 51 and 52.

The data measurement section 300 that comprises the third transition time information collection means 100#3 and the multiplexer 350 needs only to sample the signals converted into the logical signals at the same threshold level Vref by one type of multiphase STB. The measurement section can accordingly be constituted as shown in the other constitutional example of a data measurement section of FIG. 12. In other words, the constitution can be realized by the high-side multiphase strobe means 21 and the edge detection section 51. That is, by one high-side multiphase strobe means 21, signals are converted into logical signals at a threshold level Vref, holding signals D#1 to D#m output therefrom are supplied to the edge detection section 51, and data change point information Tdata of a rising side edge or a falling side edge selected based on a data edge selecting signal S3 is output. This constitutional example can be more inexpensive.

The multiplexer 350 shown in FIG. 1 is a data selector of a 2-input 1-output type and an n-bit width, and supplies the data change point information Tdata obtained as a result of selecting the rising edge timing information Tdh or the falling edge timing information Td1 generated by the third transition time information collection means 100#3 to the phase difference calculation section 400 based on the data edge selecting signal S3.

The cross point calculation section 200 calculates a cross point based on the two bits of timing information T1, T2 of the positive clock signal CLKP side and the two bits of timing information T3, T4 of the negative clock signal CLKN side. This will be described with reference to calculation explanatory views of cross point information Tcross of FIGS. 5a to 5c. The calculation is executed by assuming that waveforms change almost linearly in a waveform section of the timing information T1 and T2 and a waveform section of the timing information T3 and T4.

The cross point information Tcross of FIG. 5a can be obtained by a computing equation of Tcross=$\{(T2 \times T4)-(T1 \times T3)\}/\{(T2-T1)+(T4-T3)\}$.

Incidentally, even in the case of irregular bits of timing information T1 to T4 of FIG. 5c, the cross point information can be obtained by the computing equation. This means that a desired linear waveform portion can be measured in a waveform section of clock transition.

FIG. 3 shows a specific internal constitutional example of the cross point calculation section 200. The constitutional example comprises two multipliers, three subtracters, one adder, and one divider corresponding to the computing equation. Based on data obtained as a result of the calculation, desired n-bit cross point information Tcross is supplied to the phase difference calculation section 400. Incidentally, since the calculation time is about several hundred nanoseconds, the sampling measurement of the DUT is executed at a cycle of a corresponding time or more. Depending on DUT characteristics, DUT evaluation can be practically carried out by practically repeating, e.g., sampling measurement of several thousand times or more and PASS/FAIL determination.

The phase difference calculation section 400 shown in FIG. 1 obtains a relative phase difference $\Delta T$ between both signals, i.e., the cross point of the differential clock signal CLK and the data signal DATA. That is, the phase difference calculation section 400 receives the cross point information Tcross and the data change point information Tdata obtained as described above, calculates a phase difference ΔT therebetween, and supplies it to the PASS/FAIL determination section 500. In actual measurement of the semiconductor test apparatus, strobe signals of individual timings are used. Thus, an offset time Toffset which is a time difference between the strobe signals is applied to calculate a phase difference ΔT. Accordingly, for the phase difference ΔT, an arithmetic operation of ΔT=(Tdata+Toffset)−Tcross is executed. Incidentally, since the offset time Toffset varies depending on a DUT type standard, a positive, negative or zero value can be taken.

The PASS/FAIL determination section 500 determines PASS which is within a phase difference standard of the DUT type, and FAIL which is outside the range. That is, based on a maximum phase difference Tmax and a minimum phase difference Tmin of the DUT standard, the phase difference ΔT obtained above is compared. PASS is determined in the case of Tmim≦ΔT≦Tmax, and FAIL is determined in other cases.

According to the invention constitutional example of FIG. 1, the constitution comprises the means for determining PASS/FAIL by specifying the cross point of the differential cross signals CLK at the same measuring time, obtaining the phase difference between both signals, i.e., the cross point and the data signal DATA, and determining whether the obtained phase difference is within the predetermined standard or not. Thus, a great advantage can be provided which can accurately determine PASS/FAIL of the relative phase difference between the two signals based on the cross point of the differential clock signals. Needless to say, even when there are instantaneous jitters or fluctuation between the two signals, the PASS/FAIL can be accurately determined.

A technical idea of the invention is not limited to the specific constitutional example, the connection form example of the aforementioned embodiment. Further, based on the technical ideal of the invention, the embodiment can be properly modified to be widely used.

The constitutional example of FIG. 1 has been described by taking the specific example of the differential clock signal CLK. However, the constitutional example can be applied to differential signals other than the clock signal CLK.

The constitutional example of FIG. 1 has been described by taking the specific example of testing the phase difference under the signal conditions of the 1-channel differential clock signal CLK and the 1-channel data signal DATA. However, the constitutional example may be applied to the other signal conditions. The first example is another constitutional example shown in FIG. 13 in which the relative phase difference between the two types of differential signals is obtained to determine the PASS/FAIL. To enable testing of the phase difference between the two types of differential signals, by disposing two types of cross point measurement sections 600 shown in FIG. 1, it is possible to determine PASS/FAIL of a phase difference between the types of differential signals. The second example is that the plurality of data measurement sections 300 shown in FIG. 1 to measure the data signal DATA are disposed, the phase difference calculation section 400 and the PASS/FAIL determination section 500 are disposed corresponding to the measurement sections, and thus relative phase differences of a plurality of types of data signals DATA can be subjected to PASS/FAIL determination altogether.

Depending on the DUT device type, the differential signal such as a differential clock signal which is a testing target is normally a specific signal of one channel or about several channels. Accordingly, for the number of channels of the aforementioned constitution disposed in the semiconductor test apparatus, the number of channels corresponding to the DUT is enough.

In the case of simultaneously testing a differential clock signal of one channel and data signals DATA of a plurality of channels, it is only necessary to employ a corresponding constitution which comprises a data measurement section 300 of a plurality of channels, a phase difference calculation section 400 and PASS/FAIL determination section 500 corresponding to the data measurement section 300 of the plurality of channels.

The constitutional example of FIG. 1 is a specific example in which all are realized by the circuits. However, the invention is not limited to such. For example, the apparatus can be realized by another constitutional example shown in FIG. 9. According to this constitutional example, the cross point calculation section 200, the phase difference calculation section 400 and the PASS/FAIL determination section 500 of FIG. 1 are removed and, instead, an edge data storage memory 700, an address generations section 620, and a cross point calculation/phase difference calculation/PASS/FAIL determination processing section 650 are added.

The edge data storage memory 700 is a memory of a desired capacity, and stores bits of timing information T1 to T4 and data change point information Tdata altogether for each sampling measurement. Accordingly, sampling measurement results of many times can be stored.

The address generation section 620 generates addresses for the memory, and generates an address signal whose address value is incremented by 1 by an INC signal for each sampling measurement, and supplies the signal to the edge data storage memory 700.

The cross point calculation/phase difference calculation/PASS/FAIL determination processing section 650 calculates a cross point by software to make determination, sequentially reads edge data stored in the edge data storage memory 700, calculates cross point information Tcross by software, calculates a phase difference ΔT by software, determines PASS/FAIL of the phase difference ΔT based on a maximum phase difference Tmax and a minimum phase difference Tmin of an expected value, and outputs a determination result of PASS/FAIL as in the case of the constitutional example of FIG. 1.

Therefore, an advantage of reducing the circuit size more than the constitutional example of FIG. 1 can be obtained.

Additionally, the cross point calculation section 200 shown in FIG. 3 may comprise pipeline circuitry or an interleave constitution to calculate in synchronization with a clock when desired. In this case, it is possible to greatly reduce the sampling cycle of repeated sampling measurement.

Figure 11:
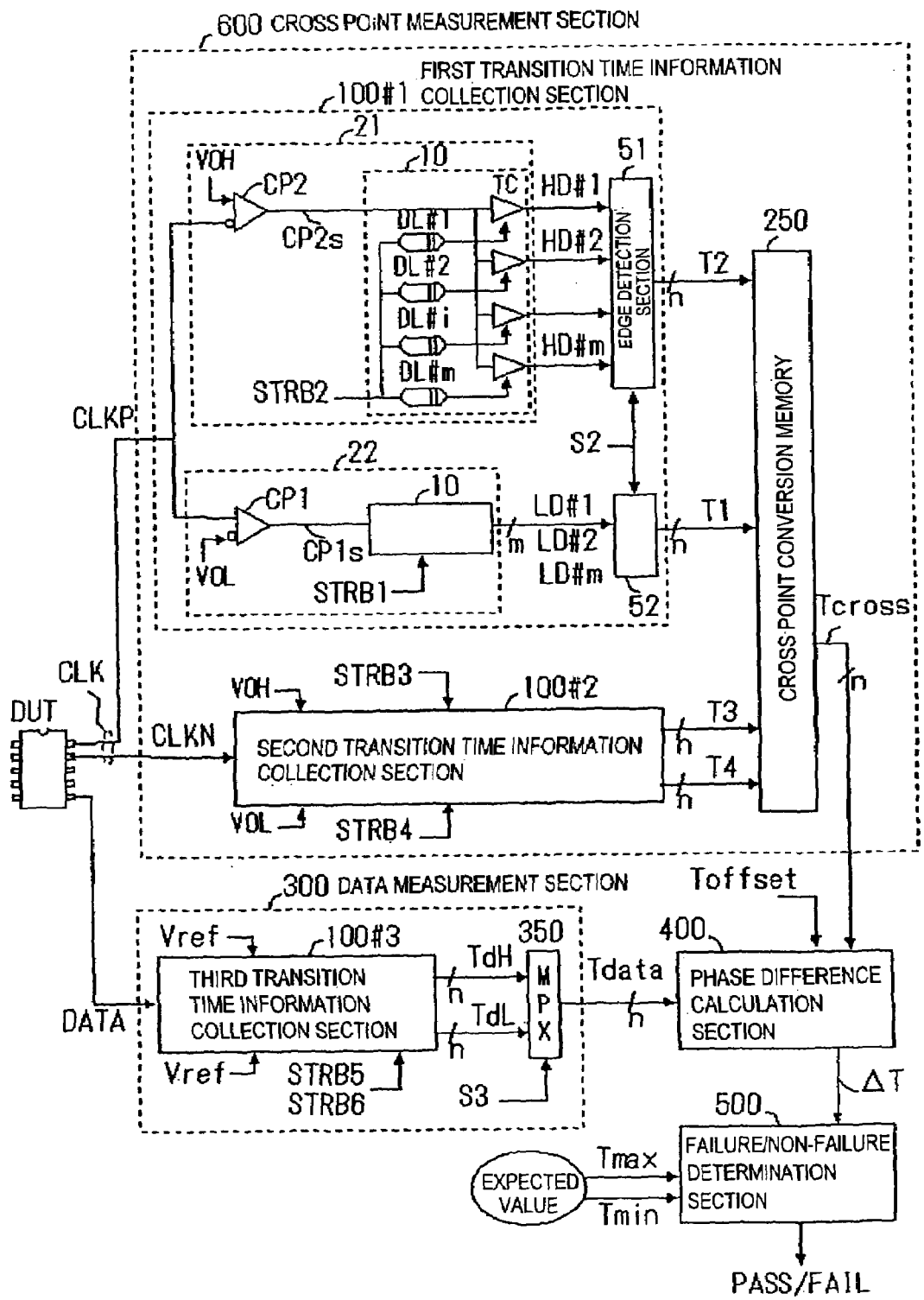
FIG. 11 is a view showing yet another main portion block constitutional example when a differential clock signal and a single end data signal DATA output from the DUT are received, and a relative phase difference therebetween is obtained to determine PASS/FAIL.
Figure 12:
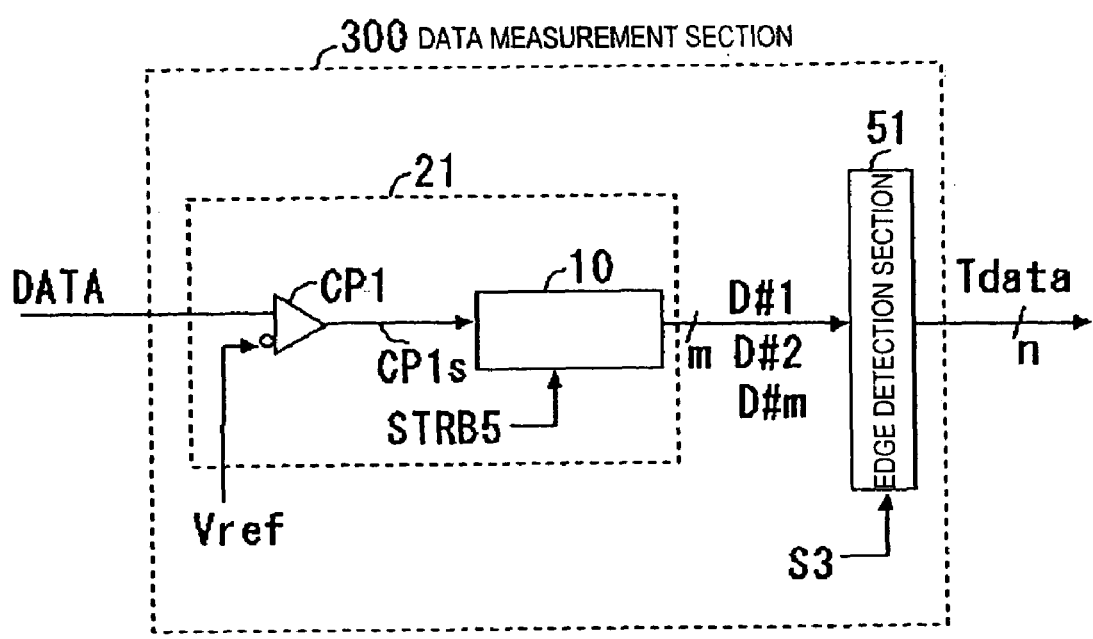
FIG. 12 is a view showing another constitutional example of a data measurement section 300.
Figure 13:
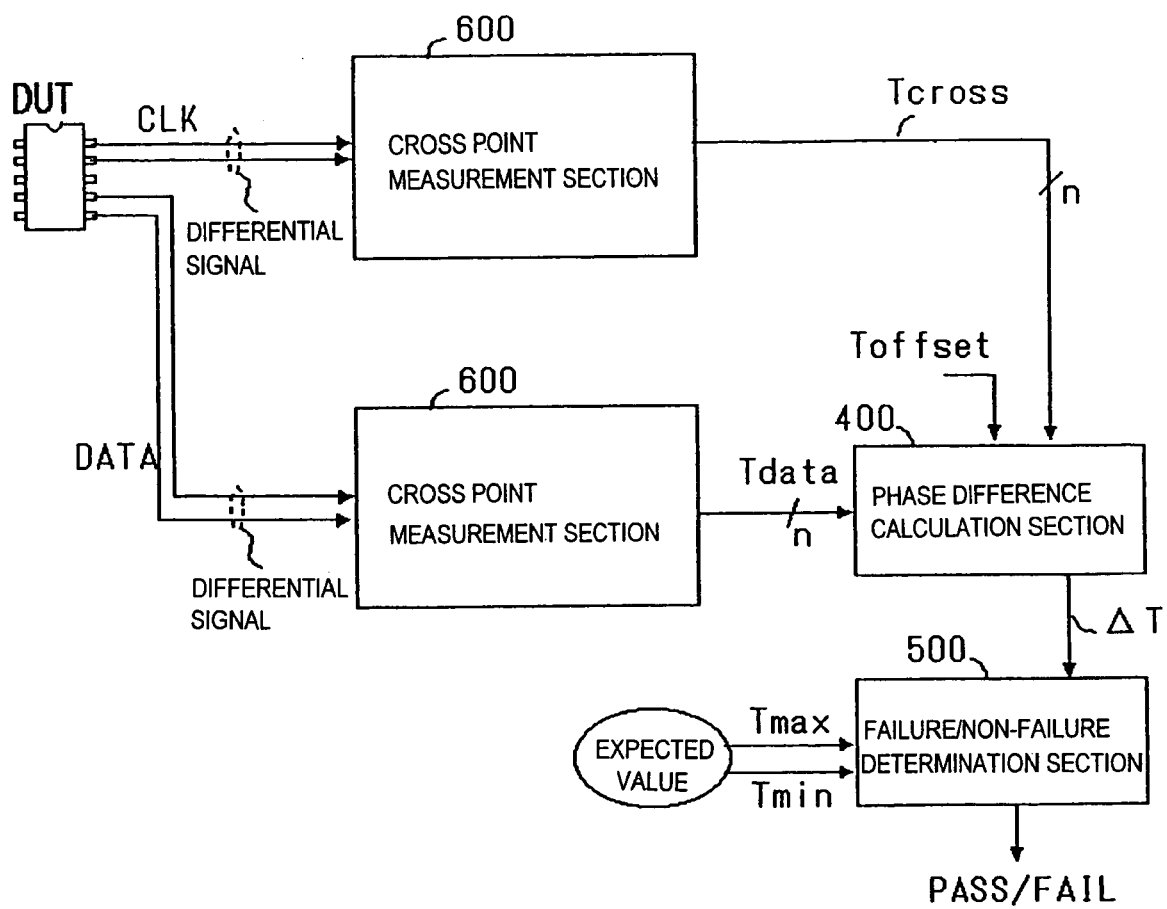
FIG. 13 is a view showing another constitutional example in which a relative phase difference between two types of differential signals is obtained to determine PASS/FAIL.

FIG. 11 shows another constitutional example. According to this constitutional example, a cross point conversion memory 250 for data conversion is disposed in place of the cross point calculation section 200 of the constitution of FIG. 1. The cross point conversion memory 250 receives input data of bits of timing information T1 to T4, thereby reads contents of a specified address, and outputs the contents as cross point information Tcross. In the case of n=5 bits, a memory (RAM/ROM) of an address space of 5×4=20 bits is disposed. Here, contents of the memory are prestored so that the cross point information Tcross can be read. Accordingly, a function similar to that of the cross point calculation section 200 can be realized.

Figure 10:
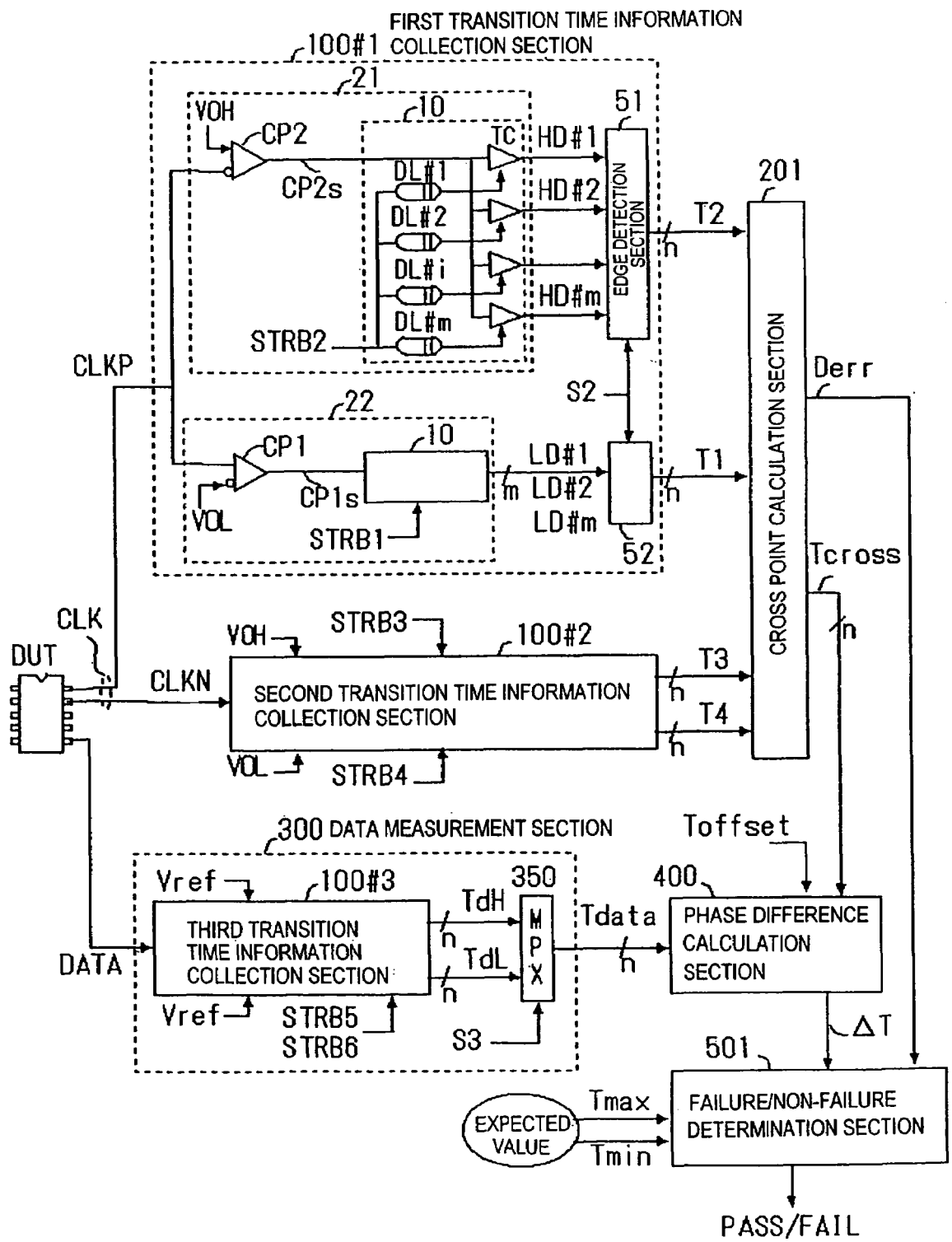
FIG. 10 is a view showing yet another main portion block constitutional example of the semiconductor test apparatus when a differential clock signal and a single end data signal DATA output from the DUT are received, and a relative phase difference therebetween is obtained to determine PASS/FAIL.

FIG. 10 shows another constitutional example. According to this example, the cross point calculation section 200 and the PASS/FAIL determination section 500 of the constitution of FIG. 1 are changed to a cross point calculation section 201 and PASS/FAIL determination section 501. Since no cross point is detected when one of input bits of timing information T1 to T4 is "0", the cross point calculation section 201 generates a data error signal Derr based on the understanding that sampling measurement has not been executed in a normal position. The PASS/FAIL determination section 501 controls its operation so as not to execute PASS/FAIL determination when it receives the data error signal Derr.

Accordingly, as a result of PASS/FAIL determination executed only when the sampling measurement is carried out in the normal position, for example, when the differential clock signal CLK and a test cycle (test rate) of the semiconductor test apparatus are in an asynchronous relation to each other, or when large fluctuation occurs in the clock frequency of the differential clock signal CLK, sampling measurement can be normally executed at a fixed probability frequency. Thus, a great advantage can be provided which enables accurate PASS/FAIL determination when the sampling measurement can be normally executed.

Furthermore, for the portions practically applied to the aforementioned components or the functional means for realization, constituting means may be employed to realize the portions based on both of software or a microprogram and a hardware logic, or constituting means for realization based on software may be employed.

INDUSTRIAL APPLICABILITY

As apparent from the foregoing, the present invention has the following effects.

As described above, according to the invention, the constitution is employed which comprises the means for determining PASS/FAIL by specifying the cross point of the differential clock signals CLK at the same measurement time, obtaining the phase difference between both signals, i.e., the cross point and the data signal DATA, and determining whether the obtained phase difference is within a predetermined standard or not. Thus, the invention can provide a great advantage that it is possible to accurately determine PASS/FAIL of a relative phase difference between both signals based on the cross point of the differential clock signals.

Additionally, according to the constitutional example of FIG. 10, the invention can provide an advantage that as a result of executing the PASS/FAIL determination only when sampling measurement is carried out in a normal position, even in the case of an asynchronous relation between the differential clock signal CLK and the test cycle (test rate) of the semiconductor test apparatus, it is possible to accurately determine PASS/FAIL based on a result of proper sampling measurement.

Thus, technical effects of the invention are great, and industrial economic effects are also large.

The invention claimed is:

1. A semiconductor test apparatus, comprising:
differential signal timing measurement means for outputting cross point information obtained by measuring a timing of a cross point of differential signals from a device under test (DUT);
non-differential signal timing measurement means for outputting data change point information obtained by measuring a timing of transition of logic of a data signal from the DUT;
phase difference calculation means for outputting a phase difference obtained by calculating a relative phase difference between the cross point information and the data change point information; and
PASS/FAIL determination means for determining PASS/FAIL of the phase difference of the DUT with respect to a predetermined range based on predetermined upper and lower limit threshold values or one of the threshold values;
wherein the differential signal timing measurement means comprises first transition information measurement means for converting the differential signals into logical signals at predetermined threshold levels for measuring two points before and after the cross point with respect to a transition waveform of one of the output differential signals, sampling and measuring the logical signals based on a multiphase strobe signal, then converting the logical signals into code data, and outputting the code data as timing information, second transition information measurement means for converting the differential signals into logical signals at predetermined threshold levels for measuring two points before and after the cross point with respect to a transition waveform of the other of the output differential signals, sampling and measuring the signals based on a multiphase strobe signal, then converting the signals into code data, and outputting the code data as timing information, and cross point calculation means for specifying a position of intersection of both straight lines as the cross point information, the straight lines being obtained by the code data from the first and second transition information measurement means; and
wherein the non-differential signal timing measurement means comprises data transition time information collection means for receiving the data signal from the DUT, converting the data signal into a logical signal at a predetermined threshold level, sampling and measuring the logical signal based on a multiphase strobe signal, converting the logical signal into code data indicating timing information of one of rising and falling of the data signal, and then outputting code data as data change point information.

2. The semiconductor test apparatus according to claim 1,:
wherein the first transition information measurement means converts the differential signals into the logical signals at predetermined two low and high threshold levels, samples and measures the logical signals based on the multiphase strobe signal, converts the logical signals into code data, and outputs the code data as a first timing signal and a second timing signal,
wherein the second transition information measurement means converts the differential signals into the logical signals at predetermined two high and low threshold levels, samples and measures the logical signals based on the multiphase strobe signal, converts the logical signals into code data, and outputs the code data as a third timing information and fourth timing information, and
wherein the cross point calculation means obtains the position of intersection of both straight lines as the cross point information, the straight lines being the first straight line through which one transition waveform passes based on the first timing information and the second timing information, and the second straight line through which the other transition waveform passes based on the third timing information and the fourth timing information.

3. The semiconductor test apparatus according to claim 2, wherein the cross point calculation means comprises a cross point conversion memory which prestores the cross point information corresponding to an arithmetic operation, receives the timing information at address input terminals, and outputs data as the cross point information.

4. The semiconductor test apparatus according to claim 1, wherein the phase difference calculation means receives the cross point information from the cross point calculation means and the data change point information from the data transition time information collection means, and outputs the relative phase difference obtained by calculating a difference between both data, or a phase difference obtained as a result of calculating a predetermined offset amount of the phase difference.

5. The semiconductor test apparatus according to claim 2, further comprising PASS/FAIL determination control means which causes the cross point calculation means to generate a data error signal when a data value of at least one of four bits of timing information corresponding to the first timing information, the second timing information, the third timing information, and the fourth timing information, output from the transition information measurement means is "0", and the PASS/FAIL determination means comprises means for controlling its operation not to execute PASS/FAIL determination when the data error signal is received.

6. A semiconductor test apparatus which measures a timing of a cross point of differential signals output from a device under test (DUT), comprising:
   first transition information measurement means for converting differential signals into logical signals at predetermined threshold levels for measuring two points before and after the cross point with respect to a transition waveform of one of the output differential signals, sampling and measuring the logical signals based on a multiphase strobe signal, converting the logical signals into code data, and then outputting the code data as timing information;
   second transition information measurement means for converting the differential signals into logical values at predetermined threshold levels for measuring two points before and after the cross point with respect to a transition waveform of the other of the output differential signals, sampling and measuring the logical signals based on a multiphase strobe signal, converting the logical signals into code data, and then outputting the code data as timing information; and
   cross point calculation means for specifying a position of intersection of both straight lines as cross point information, the straight lines being a first straight line which is defined by the timing information obtained from the transition waveform of one of the output differential signals, and a second straight line which is defined by the timing information obtained from the transition waveform of the other of the output differential signals.

7. A semiconductor test apparatus which measures a relative phase difference between a cross point and a data signal output from a device under test (DUT) by using a timing of the cross point of differential signals output from the DUT as a reference, comprising:
   first transition information measurement means for converting the differential signals into logical signals at predetermined low and high threshold levels, sampling and measuring the logical signals based on a multiphase strobe signal, converting the logical signals into code data, and then outputting the code data as first timing information and second timing information;
   second transition information measurement means for converting the differential signals into logical values at predetermined high and low threshold levels with respect to a transition waveform of the other of the output differential signals, sampling and measuring the logical signals based on a multiphase strobe signal, converting the logical signals into code data, and then outputting the code data as third timing information and fourth timing information;
   data transition time information collection means for receiving the data signal from the DUT, converting the data signal into a logical signal at a predetermined threshold level, then sampling and measuring the logical signal based on a multiphase strobe signal, converting the logical signal into code data indicating a rising or falling timing of the data signal, and outputting the code data as data change point information; and
   edge data storage means for storing, in response to a predetermined number of measuring times, the timing information measured by the first transition information measurement means, the timing information measured by the second transition information measurement means, and data change point information measured by the data transition time information collection means,
   wherein data contents of the edge data storage means are read, a relative phase difference between cross point information obtained by calculating the cross point and the data change point information is obtained by calculation, an arithmetic operation is executed by a number of times corresponding to the number of measuring times, and PASS/FAIL determination is made to decide whether a plurality of obtained phase differences are within a phase difference standard or not.

8. The semiconductor test apparatus according to claim 7, further comprising means for receiving the plurality of phase differences obtained by the cross point calculation/PASS/FAIL determination processing means corresponding to the number of measuring times, and obtaining a fluctuation amount of the plurality of phase differences $\Delta T$ to specify a jitter amount between both signals.

* * * * *